United States Patent [19]
Bariya et al.

[11] Patent Number: 5,443,941
[45] Date of Patent: Aug. 22, 1995

[54] PLASMA POLYMER ANTIREFLECTIVE COATING

[75] Inventors: Anand J. Bariya, Mountain View, Calif.; Satyendra S. Sethi, Austin, Tex.; Kevin C. Brown, Sunnyvale, Calif.

[73] Assignee: National Semiconductor Corporation, Santa Clara, Calif.

[21] Appl. No.: 25,040

[22] Filed: Mar. 1, 1993

[51] Int. Cl.⁶ ............................................. G03F 7/00
[52] U.S. Cl. ................................. 430/313; 430/317; 430/329; 216/48; 216/37; 216/67
[58] Field of Search ............... 430/311, 313, 317, 318, 430/327, 329; 156/643, 659.1

[56] References Cited

U.S. PATENT DOCUMENTS

| | | | |
|---|---|---|---|
| 4,614,433 | 9/1986 | Feldman | 356/401 |
| 4,668,335 | 5/1987 | Mockler | 156/643 |

*Primary Examiner*—Kathleen Duda
*Attorney, Agent, or Firm*—Hickman & Beyer

[57] ABSTRACT

An antireflective coating used in the photolithography process is applied and removed in a plasma reactor. The halocarbon plasma polymer such as fluorocarbon plasma polymer of the present invention provides an improved antireflective coating.

10 Claims, 6 Drawing Sheets

PLASMA POLYMER ANTIREFLECTIVE COATING

BRIEF DESCRIPTION OF THE INVENTION

The present invention relates to antireflective coatings used in the photolithography process, and more specifically relates to a plasma polymer antireflective applied to a surface in a plasma reactor.

BACKGROUND OF THE INVENTION

In the manufacture of integrated circuits, photolithography is used to establish an integrated circuit design on a surface. Important to the continuing development of photolithography are methods which provide for increased chip complexity and decreased size while simultaneously increasing yield and reducing costs.

Briefly, the photolithography process involves the application of a film of light-sensitive polymeric material know as "photoresist" (or simply, "resist") on the wafer surface. A glass mask known as a "reticle" is then positioned above the resist. The reticle has on it the pattern that is to be transcribed into the resist. The pattern consists of features that are opaque to light, portions of the reticle that do not have an opaque feature are transparent. Light is passed through the reticle and is incident on the resist. Due to the opaque features on the reticle, some portions of the resist film are unexposed to light. Thus, the pattern on the reticle is transcribed into the resist in the form of exposed or unexposed regions. The "exposed" resist is then "developed" in a solvent solution. For a +ve (−ve) resist, exposed (unexposed) regions are dissolved away, having a resist pattern on the wafer surface that is a copy of the pattern on the reticle. In subsequent processing steps, the patterned resist acts as a mask for etching patterns into the substrate.

Turning to FIG. 1, when resist 11 is coated on a wafer with an underlying topography, such as step 12, the thickness of the resist varies over the step. As indicated in FIG. 1, the resist's varying thickness causes area A to have a substantially thicker resist coating than area B, and therefore the energy density coupled in the resist is different at these two points. Hence an energy dose which exposes out the resist at point A will cause the resist to be over-exposed at point B, resulting in a variation of the linewidth as it crosses a step.

In order to control light, various anti-reflective techniques have been developed. For example, antireflective coatings (ARCs) are deposited onto a wafer surface and/or on top of one resist layer. Dyes or absorbers have been added to resist itself to control light absorption. Moreover, optical thicknesses have been selected that avoid quarter wavelength multiples of the exposing energy and wavelengths have been mixed to avoid non-uniform intensity distribution in the resist layers.

Other considerations must also be accounted for in suppressing light scattering. For example, surface reflections from different types of substrates vary according to their type and structure. The amount of reflection from both aluminum and silicon varies. Moreover, interfering light from reflections from resist and substrate interference results in light coupling at regular intervals in the resist, causing line-width variations.

An ARC is a thin film, in the range of 100 to 250 nm thick, and is applied to metallization or other highly reflective films onto which submicron imaging scale dimensions are to be placed. These coatings can be applied to within 10 nm coating uniformity when spin-applied. The ARC's application is followed by a spin-applied resist coating. The ARCs presently used are organic materials, both polyimide and non-polyimide based. Moreover, certain inorganic materials (mainly metallic) such as TiN, $TaSi_2$, TiW, and α-Si are used.

While the presently used ARCs provide critical dimension control, they cannot be applied with uniform thickness over a step 12, as shown in FIG. 2. The thickness of an ARC's coating 14 varies over the step 12 and therefore, they are susceptible to the effects of undesirable optical phenomenon as well. Furthermore, another disadvantage is that their removal after the etching step requires special processing. While the resist is removed by subjecting it to an oxygen plasma, the ARC is removed by a separate step involving solvents or similar removal substances.

SUMMARY OF THE INVENTION

The antireflective coating of the present invention is an halocarbon plasma polymer which is deposited onto the surface of an intermediate product in the process of the manufacture of an integrated circuit. One halocarbon plasma polymer of the present invention is a fluorocarbon plasma polymer which can be applied by a typical plasma etcher generating a glow plasma which is deposited onto the surface of the material to be photolithography patterned. The antireflective coating of the present invention can be removed from the wafer surface in the same step as resist removal, thus eliminating a step in the manufacturing process of integrated circuits.

DETAILED DESCRIPTION OF THE INVENTION

For plasma etching, gases such as $CHF_3$, $CF_4$ or $C_2F_6$ plus argon are pumped into the etching chamber where they are subjected to an electric field so that they form a plasma. When using some of these gases, a fluorocarbon film forms as a by-product. This film has been usually considered undesirable and so its formation is discouraged.

However, in accordance with the present invention, a thin fluorocarbon plasma polymer film which forms when a glow discharge is struck in a fluorocarbon gas or fluorocarbon-containing gas, is used as an ARC. Fluorocarbon film's antireflective properties provide a highly light absorbent material and therefore an ARC superior to those of the prior art.

There are several gases which can be used to form a fluorocarbon film. For example, the gases mentioned above, $CHF_3$ ("Freon 23") or $C_2F_6$ plus argon form a plasma polymer anti-reflective coating (PPARC) of the present invention. Also, all hydrogen-containing fluorocarbons, most perfluoroalkanes, and unsaturated fluorocarbons such as tetrafluoroethylene form a PPARC. Moreover, other gases including halocarbons, such as bromocarbons, can be used to form plasma polymer films. Therefore, many types PPARC films can be deposited in the etching chamber. Moreover, the plasma polymer of the present invention can be deposited on many surfaces, for example, metals, polysilicon, single-crystal silicon, silicon nitride and silicon dioxide.

Figure 3:
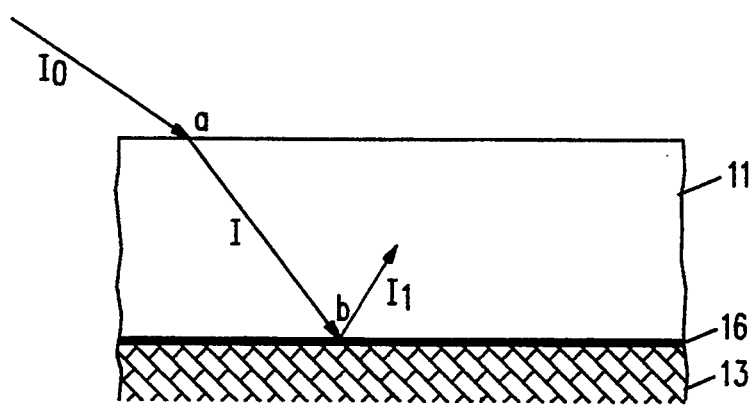
FIG. 3 depicts a substrate coated by an ARC which is in turn coated by a resist layer upon which a light ray is incident.

Incorporation of the highly absorbent PPARC on a substrate underneath the resist (a bottom ARC) eliminates both the standing wave effect as well as the interference effect as shown in FIG. 3. The incident light ray $I_o$ strikes point 'a' on the resist's 11 surface and then is transmitted through the resist until it strikes the PPARC 16. The PPARC absorbs almost all of the light with only a small component (short arrow) being reflected from the substrate 13. The short arrow indicates that the light is absorbed by the PPARC. Thus, the unwanted effects due to the reflected light are nearly eliminated.

Figure 1:
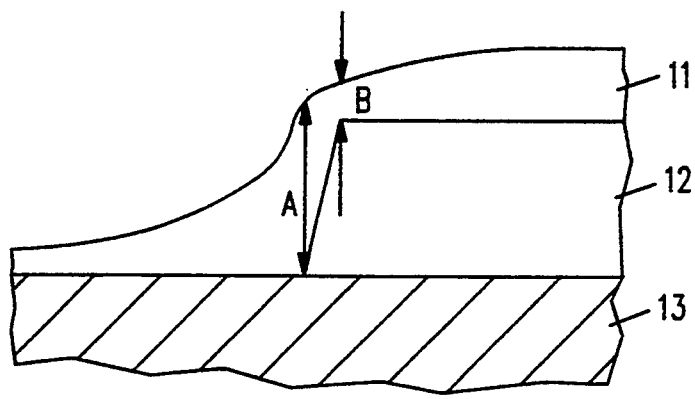
FIG. 1 shows the underlying topography of a wafer coated by a coating with varying thickness in accordance with the prior art.
Figure 2:
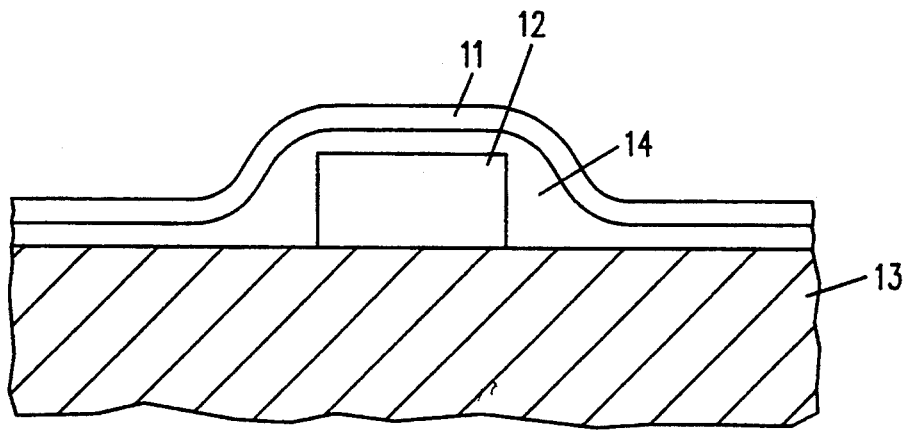
FIG. 2 shows the underlying topography of a wafer coated by an ARC which is in turn coated by a layer of resist in accordance with the prior art.
Figure 4:
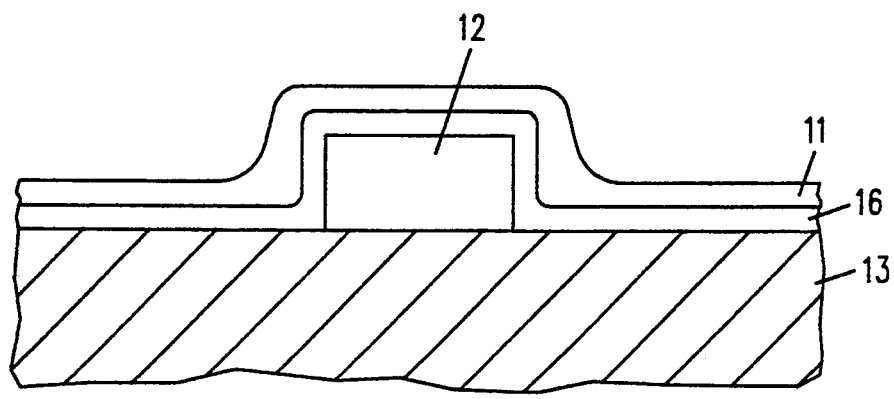
FIG. 4 shows a surface having an underlying topography upon which the Plasma Polymer Antireflection Coating (PPARC) of the present invention and a layer of resist is deposited.

Another feature of PPARC 16 is that when it is applied to a surface with underlying topography, it conforms to the sidewalls of a step 12 as shown in FIG. 4. Returning to FIG. 2, there it is shown that ARC 14 of the prior art, when applied to an uneven underlying topography, forms layers of varying thickness. However because the PPARC 16 conforms to the sidewalls of step 12 (see FIG. 4), its thickness remains unaltered over topography.

Figure 5:
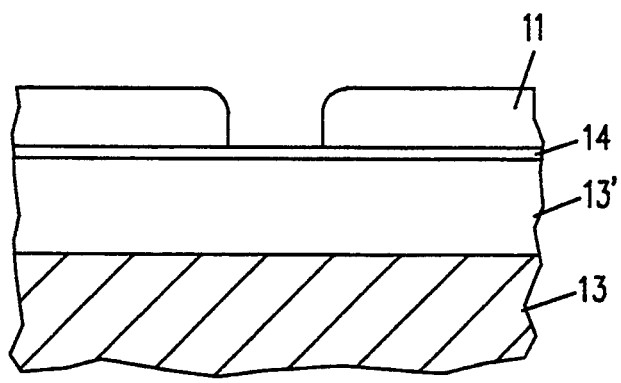
FIG. 5 shows the resist profile of the prior art where an ARC of the prior art was used.
Figure 6:
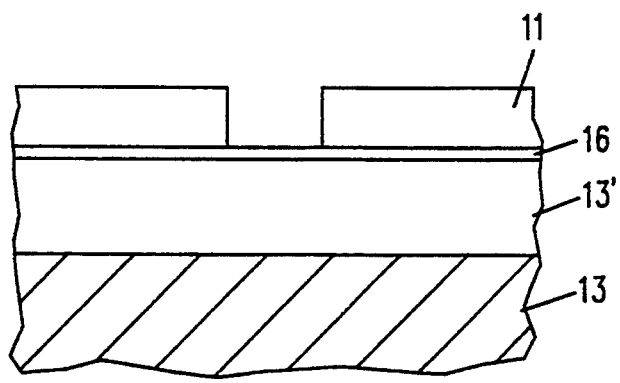
FIG. 6 shows the resist profile of the prior art where a PPARC of the present invention was used.

In using an ARC of the prior art, after the resist layer has been developed and exposed, the resist profiles as shown in FIG. 5 have what is known as a "foot." The profiles do not have sharp corners. A foot is generally caused by absorption and, because the resist and ARC which are spun on sequentially, frequently are mixed. FIGS. 5 and 6 also show a barrier layer 13' which is deposited on the substrate 13. However, using an ARC of the present invention, the resist profiles do not have "foot" characteristics, but are vertical as shown in FIG. 6. Because the PPARC is deposited in a plasma reactor and then the resist is spun on, they do not mix. Therefore, a foot is not caused. Accordingly, by using the PPARC 16 of the present invention instead of using the ARC of the prior art, the resist profiles result in a reduced etch bias.

Figure 7:
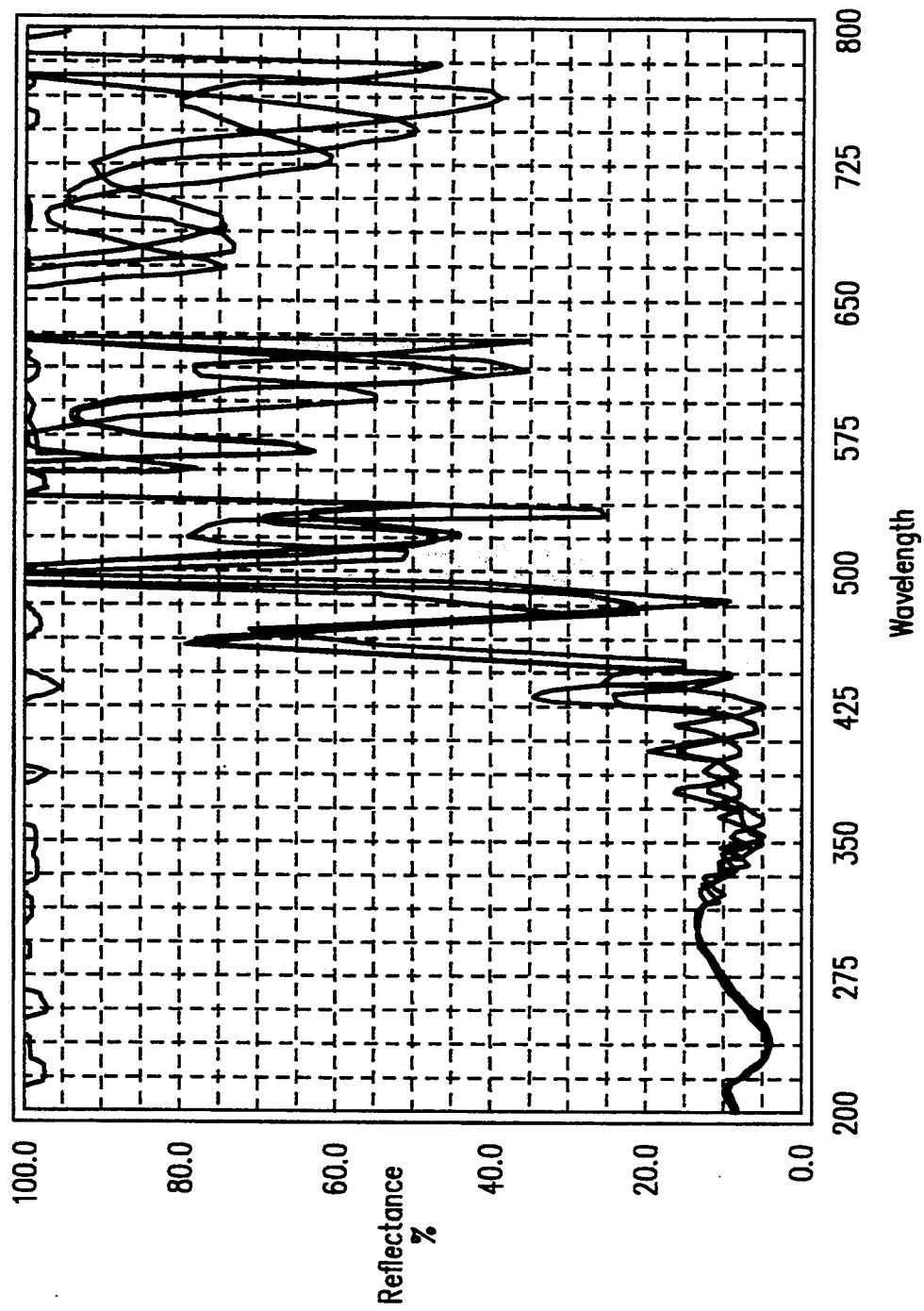
FIG. 7 is a plot of wavelength versus percentage of reflection of the PPARC of the present invention deposited on aluminum.
Figure 8:
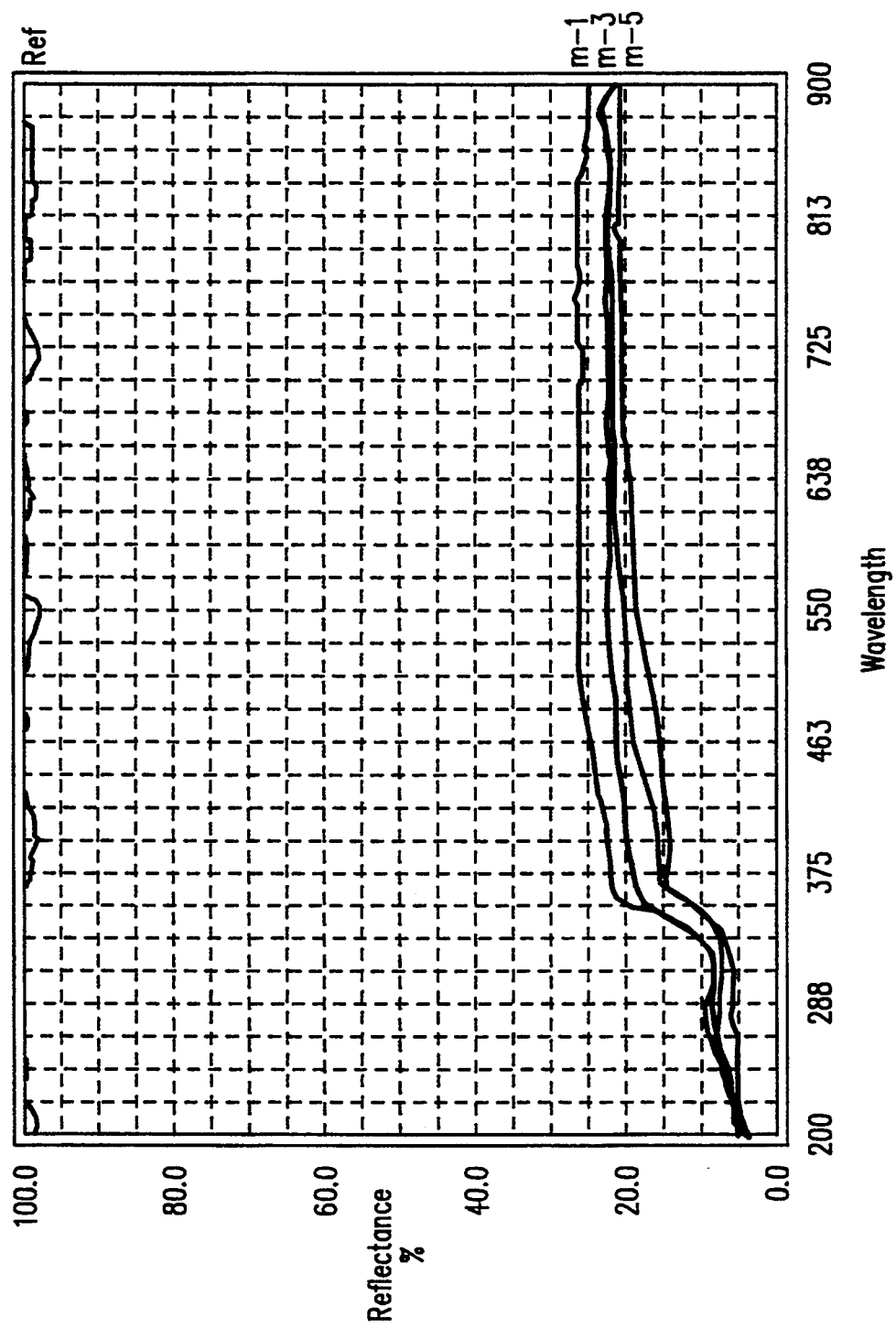
FIG. 8 is a plot of wavelength versus percentage of reflection of the PPARC of the present invention deposited on silicon.

The antireflective properties of a fluorocarbon plasma polymer film of the present invention are illustrated in the graphs of FIGS. 7 and 8, which show reflectivity versus wavelength plots for PPARC deposited on aluminum and polysilicon, respectively. The different curves represent different samples with plasma polymer deposited under similar conditions and so the closeness of the curves indicates a reproducible process. The reflectivities are referenced to samples with no PPARC. In each case, the reflectivity of the reference is shown as 100% at all wavelengths.

In FIG. 7, the data indicates that reflectivity of PPARC on aluminum is very low at the wavelengths between 200 nm and 435 nm which, in photolithography processing, are the wavelengths of the most interest. In FIG. 8, the data indicates that reflectivity of PPARC on polysilicon is extremely low at the wavelengths between 200 nm and 375 nm and that it is also quite low between 375 nm and 900 nm. Because in both cases, at the wavelengths of interest the reflectivity is greatly suppressed, FIGS. 7 and 8 show that PPARC is not sensitive to variations in substrate reflectivity, across the wafer or wafer to wafer.

To generate the data shown in FIGS. 7 and 8, the plasma polymer was deposited in a $CHF_3$ glow discharge struck in a commercial, parallel plate reactive ion etching (RIE) reactor at a pressure of 800 mTorr. Moreover, many reactor types may be used for plasma polymer deposition. For example, the electrode configuration can be parallel-plate or hexode-type, the power coupling can be capacitive or inductive, and the substrate can rest on the smaller or larger electrodes of an asymmetrical system. Accordingly, the present invention has the added advantage that no new materials or equipment is required to apply the PPARC. Furthermore, most of the gases which can be used are common in-lab process gases.

Figure 9:
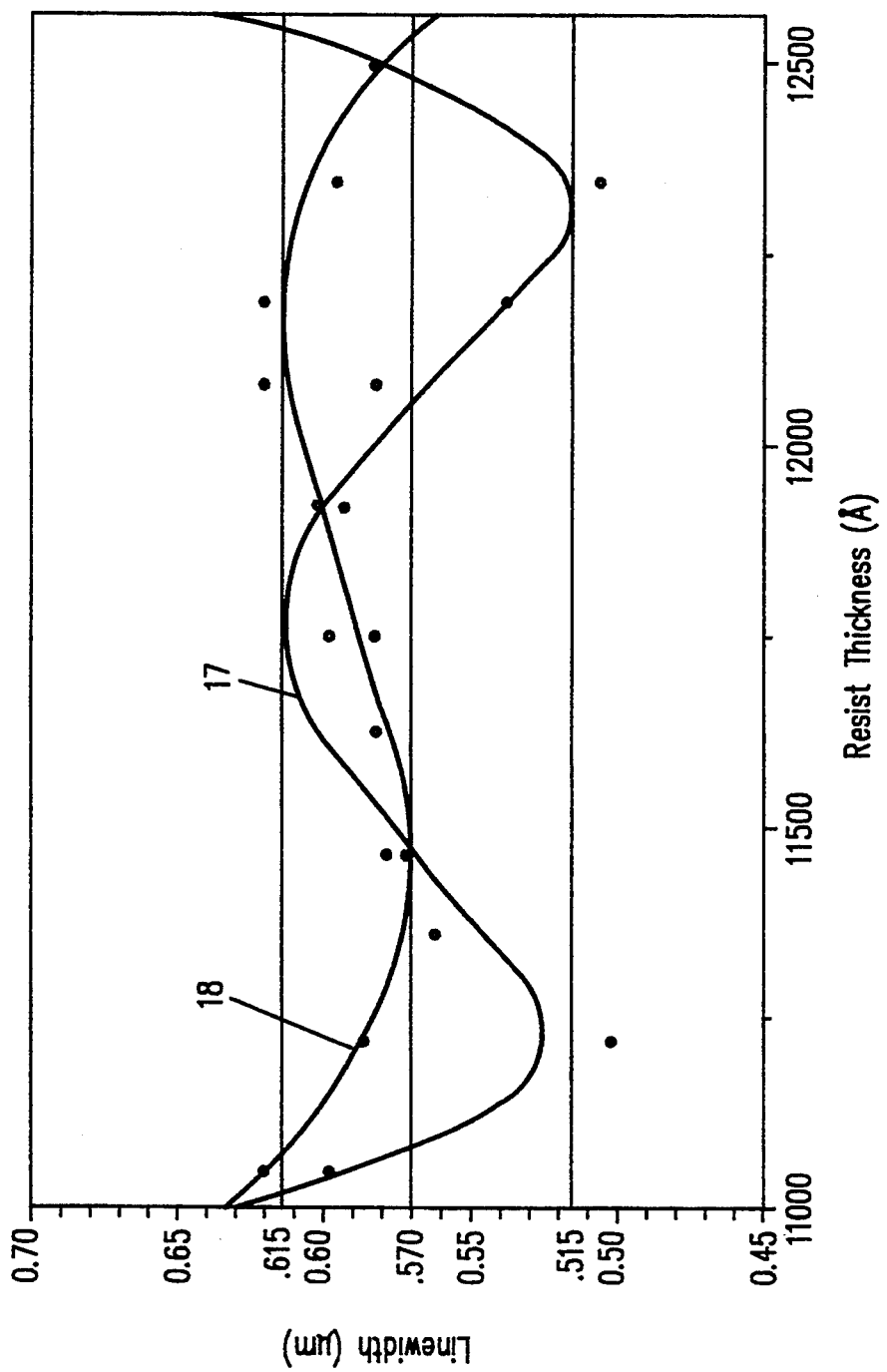
FIG. 9 is a plot of resist thickness versus linewidth showing linewidth variations resultant of etching with an ARC of the prior art and etching with no ARC.
Figure 10:
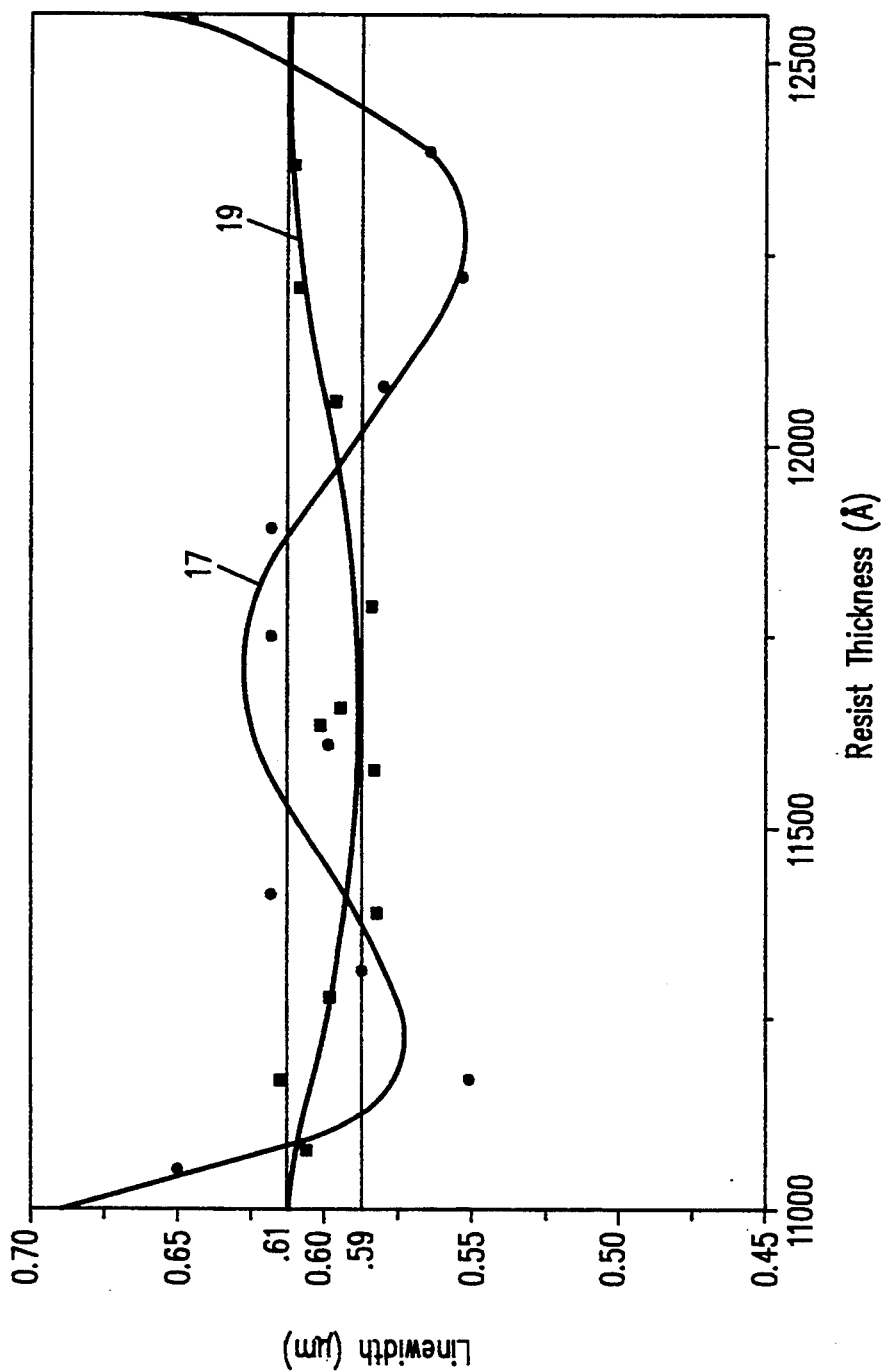
FIG. 10 is a plot of resist thickness versus linewidth showing linewidth variations resultant of etching with an PPARC of the present invention.

Turning to FIGS. 9 and 10, graphs of linewidth versus resist thickness are shown. Line 17 of FIG. 9 shows a curve fit to data points taken when no ARC was applied to a surface having a resist layer. The variation in the linewidth is approximately between 0.515 $\mu$m and 0.615 $\mu$m. Line 18 shows a curve fit to data points taken when the ARC of the prior art, a "Brewer's ARC," was applied beneath the resist layer. FIG. 9 shows a variation in linewidth for the "Brewer's ARC" approximately between 0.570 $\mu$m and 0.615 $\mu$m. Thus, the total variation in linewidth for an ARC of the prior art is 0.045 $\mu$m.

FIG. 10 shows the improved critical dimensions when a PPARC of the present invention was applied beneath the resist layer. Line 19 shows a curve fit to data points taken when PPARC was applied, showing a small variation in linewidth of approximately between 0.590 $\mu$m and 0.610 $\mu$m. Therefore, the total variation in linewidth for the PPARC is 0.020 $\mu$m, which is significantly less than that of the prior art. In other words, there is in the neighborhood of a 50% improvement in linewidth variation shown in FIG. 10, and therefore a significant improved critical dimension control.

The thickness of the PPARC's can be used to customize its antireflective properties according to the use intended. Ways of controlling the thickness of the PPARC include varying the pressure within the reactor, varying the power to the electrodes, varying the gap of the electrodes, or varying the gas flow rates. Note that Ar or other noble gases may be used as carrier gases.

After a photoresist layer is exposed and developed, the substrate undergoes plasma etching. During this step, exposed PPARC is first etched through, and then the material to be patterned is etched. In many cases the same plasma etches both materials, so that the presence of the PPARC is transparent to the etching process.

After the etching process, the photoresist is stripped off the wafer by an oxygen plasma in a plasma reactor. As mentioned above, in the prior art, the ARC is subsequently removed by a solvent. However, in accordance with the present invention, oxygen plasma also removes the PPARC with no additional processing required.

In summary, the antireflective coating of the present invention conforms to the underlying topography of a surface in the manufacture of an integrated circuit, can be removed in the same step as the removal of the resist after the photolithography process, thus eliminating a processing step, and has improved antireflective characteristics over those previously used while not requiring the addition of any new equipment or materials to the integrated circuit manufacturing process.

We claim:

1. In the manufacture of an integrated circuit by means of a photolithographic process, a method comprising the steps of:
    providing a material having a surface to be patterned using said photolithographic process;
    onto said surface, depositing a layer of halocarbon plasma polymer anti-reflective coating;
    thereafter, applying a layer of photoresist onto said layer of halocarbon plasma polymer anti-reflective coating;
    using patterning means, forming a pattern into said photoresist by exposing and developing portions of said photoresist; and
    etching said pattern into said material.

2. A method as recited in claim 1, further comprising the step of using an oxygen plasma to remove said photoresist material and said halocarbon plasma polymer anti-reflective coating.

3. A method as recited in claim 1 wherein said step of depositing a layer of halocarbon plasma polymer anti-reflective coating includes the step of generating fluorocarbon plasma polymer.

4. In the manufacture of an integrated circuit by means of a photolithographic process, a method comprising the steps of:
    preparing an intermediate product in a fabrication process in the manufacture of said integrated circuit, said intermediate product having a surface to be patterned using said photolithographic process;
    using a fluorocarbon plasma gas, depositing an anti-reflective layer on said surface to be patterned of said intermediate product;
    depositing on top of said anti-reflective layer, a layer of photoresist;
    using patterning means, forming a pattern into said photoresist by exposing and developing portions of said photoresist; and
    etching said pattern into said material.

5. A method as recited in claim 4 further comprising the step of using an oxygen plasma to remove said photoresist and said anti-reflective coating.

6. In the manufacture of an integrated circuit by means of a photolithographic process, a method comprising the steps of:
    in a plasma reactor, depositing a layer of anti-reflective coating onto a material having a surface to be patterned using said photolithographic process;
    depositing a layer of resist on said layer of anti-reflective coating
    using patterning means, forming a pattern into said resist by exposing and developing portions of said resist; and
    etching said pattern into said material.

7. A method as recited in claim 6, further comprising the step of using an oxygen plasma to remove said resist and said layer of anti-reflective coating.

8. A method as recited in claim 7 wherein said anti-reflective coating is a plasma polymer anti-reflective coating.

9. A method as recited in claim 7 wherein said anti-reflective coating is a halocarbon plasma polymer anti-reflective coating.

10. A method as recited in claim 7 wherein said anti-reflective coating is a fluorocarbon plasma polymer anti-reflective coating.

* * * * *